(12) United States Patent
Carothers et al.

(10) Patent No.: US 10,935,743 B2
(45) Date of Patent: Mar. 2, 2021

(54) VERTICAL OPTICAL VIA AND METHOD OF FABRICATION

(71) Applicant: Samsung Electronics Co., Ltd., Gyeonggi-do (KR)

(72) Inventors: Daniel N. Carothers, Lucas, TX (US); Titash Rakshit, Austin, TX (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/749,908

(22) Filed: Jan. 22, 2020

(65) Prior Publication Data

US 2020/0158970 A1    May 21, 2020

Related U.S. Application Data

(62) Division of application No. 15/965,154, filed on Apr. 27, 2018, now Pat. No. 10,585,254.

(60) Provisional application No. 62/587,835, filed on Nov. 17, 2017.

(51) Int. Cl.
| | |
|---|---|
| *G02B 6/43* | (2006.01) |
| *G02B 6/36* | (2006.01) |
| *G02B 6/136* | (2006.01) |
| *G02B 6/12* | (2006.01) |
| *H01S 5/026* | (2006.01) |
| *G02B 6/34* | (2006.01) |

(52) U.S. Cl.
CPC .......... *G02B 6/43* (2013.01); *G02B 6/12002* (2013.01); *G02B 6/136* (2013.01); *G02B 6/3652* (2013.01); *H01S 5/026* (2013.01); *G02B 6/34* (2013.01)

(58) Field of Classification Search
CPC ...... G02B 6/12; G02B 6/12002; G02B 6/136; G02B 6/293; G02B 6/34; G02B 6/4246; G02B 6/43; G02B 6/3652; G02B 6/4232; G02B 6/4249; G02B 6/4259; G02B 6/4267
USPC ..................................... 385/14, 129–132, 37
See application file for complete search history.

(56) References Cited

U.S. PATENT DOCUMENTS

| | | | |
|---|---|---|---|
| 7,645,076 B2 * | 1/2010 | Martini | .................. G02B 6/136 385/88 |
| 8,267,583 B2 | 9/2012 | Yao | |
| 8,548,288 B2 | 10/2013 | Raj | |
| 8,755,644 B2 | 6/2014 | Budd | |
| 9,236,328 B1 | 1/2016 | Leobandung | |
| 9,496,447 B2 | 11/2016 | Leobandung | |
| 9,529,150 B2 | 12/2016 | Orcutt | |

(Continued)

*Primary Examiner* — Michael P Mooney
(74) *Attorney, Agent, or Firm* — Van Pelt, Yi & James LLP

(57) ABSTRACT

A method for providing a vertical optical via for a semiconductor substrate is described. The semiconductor substrate has a front surface and a back side. A hard mask having an aperture therein is formed on the front surface. Part of the semiconductor substrate exposed by the aperture is removed to form a via hole. The via hole has a width not exceeding one hundred micrometers and a bottom. Cladding layer(s) and core layer(s) are provided in the via hole. The core layer(s) have at least a second index of refraction greater than that of the core layer(s). A portion of the semiconductor substrate including the back side is removed to expose a bottom portion of the core layer(s) and a bottom surface of the semiconductor substrate. The vertical optical via includes the cladding and core layers. The vertical optical via extends from the front surface to the bottom surface.

4 Claims, 10 Drawing Sheets

(56) References Cited

U.S. PATENT DOCUMENTS

2003/0176002 A1  9/2003 Zhang
2016/0259139 A1  9/2016 Kraft

\* cited by examiner

ND METHOD OF
VERTICAL OPTICAL VIA AND METHOD OF FABRICATION

CROSS-REFERENCE TO RELATED APPLICATIONS

This application is a divisional of U.S. patent application Ser. No. 15/965,154 entitled VERTICAL OPTICAL VIA AND METHOD OF FABRICATION filed Apr. 27, 2018, which claims priority to U.S. Provisional Patent Application No. 62/587,835 entitled VERTICAL OPTICAL VIA filed Nov. 17, 2017, both of which are incorporated herein by reference for all purposes.

BACKGROUND

Photonic devices have been integrated with a number of semiconductor technologies. Such integrated devices may have improved performance and/or additional functionality. In such integrated photonic circuits, it is desirable to support the vertical transfer of optical data between multiple layers of the device. Stated differently, optical data is desired to be transferred from a photonic device on one layer of the integrated device to another photonic device on another layer of the integrated device.

Various technologies have been developed to facilitate optical transmission between layers of the integrated device. Vertical transmission from one photonic device to another may involve waveguide to waveguide transmission between vertical waveguides. For transmission between vertical waveguides, the spacing may be desired to be twenty nanometers to not more than three hundred nanometers. Thus, such vertical transmission of optical data is limited to very small distances. Very large optical vias can vertically transmit optical data. However, these vias are multimode, which is undesirable. Large waveguides on silicon may be used to transfer optical data. Such waveguides are generally multimode and couple light into the silicon substrate, both of which are undesirable. Some such approaches also require turning mirrors, which provide a forty-five degree reflective surface to reflect light from a waveguide to the large optical via. Such mirrors are generally challenging to fabricate at small sizes.

Consequently, an improved mechanism transmission of optical information is desired.

BRIEF SUMMARY OF THE INVENTION

A method for providing a vertical optical via for a semiconductor substrate having a front surface and a back side and the vertical optical via so formed are described. The method includes forming a hard mask on the front surface of the semiconductor substrate. The hard mask has an aperture therein. A first portion of the semiconductor substrate is exposed by the aperture. The first portion of the semiconductor substrate is removed to form a via hole in the semiconductor substrate. The via hole has a bottom and a width of not more than one hundred micrometers. At least one cladding layer is provided in the via hole. The cladding layer(s) have at least a first index of refraction. At least one core layer is provided in the via hole. The core layer(s) have at least a second index of refraction greater than the at least the first index of refraction. A second portion of the semiconductor substrate including the back side and the bottom of the via hole is removed to expose a bottom portion of the layer(s) and a bottom surface of the semiconductor substrate. The vertical optical via includes the cladding layer(s) and the core layer(s). The vertical optical via extends from the front surface of the semiconductor substrate to the bottom surface.

The vertical via may provide optical transmission through the semiconductor substrate. High bandwidth, ultra-fast intra-die communication may thus be facilitated. For example, communication between a logic die and one or more DRAM dies stacked vertically on the logic die may be improved.

DETAILED DESCRIPTION OF THE INVENTION

Figure 1:
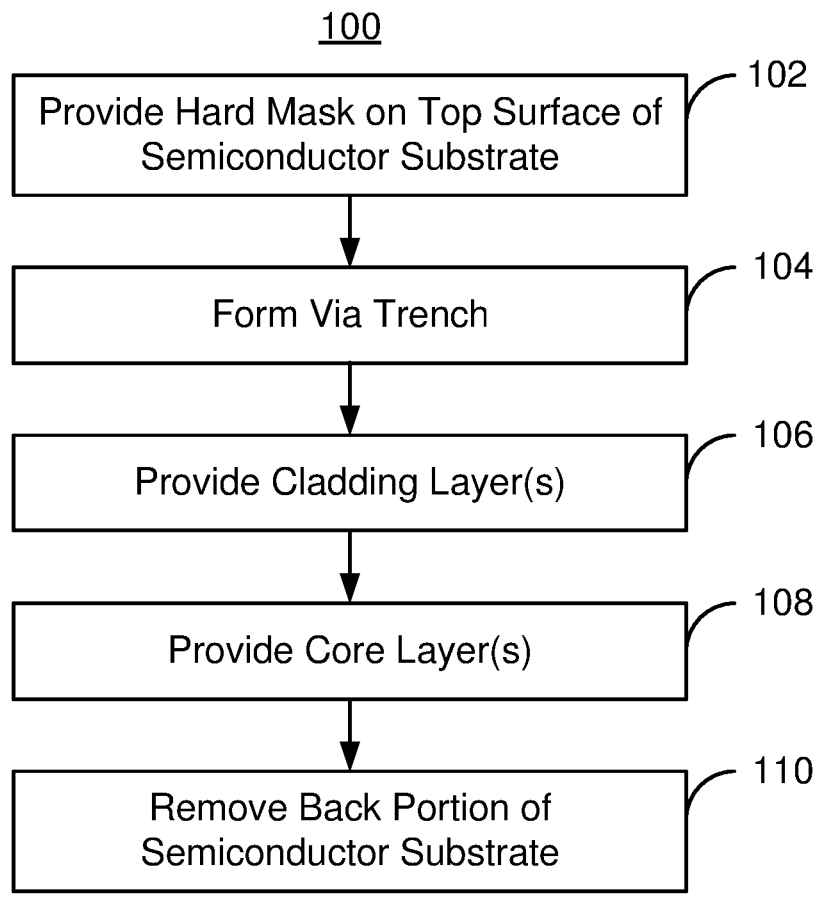
FIG. 1 is a flow chart depicting an exemplary embodiment of a method for providing a vertical optical via in a semiconductor device.

The exemplary embodiments relate to formation of optical vias that may be scaled to microscopic dimensions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations.

Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or fewer components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

A method for providing a vertical optical via for a semiconductor substrate having a front surface and a back side and the vertical optical via so formed are described. The method includes forming a hard mask on the front surface of the semiconductor substrate. The hard mask has an aperture therein. A first portion of the semiconductor substrate is exposed by the aperture. The first portion of the semiconductor substrate is removed to form a via hole in the semiconductor substrate. The via hole has a bottom and a width of not more than one hundred micrometers. At least one cladding layer is provided in the via hole. The cladding layer(s) have at least a first index of refraction. At least one core layer is provided in the via hole. The core layer(s) have at least a second index of refraction greater than the at least the first index of refraction. A second portion of the semiconductor substrate including the back side and the bottom of the via hole is removed to expose a bottom portion of the layer(s) and a bottom surface of the semiconductor substrate. The vertical optical via includes the cladding layer(s) and the core layer(s). The vertical optical via extends from the front surface of the semiconductor substrate to the bottom surface.

FIG. 1 is a flow chart depicting an exemplary embodiment of a method for providing a vertical optical via in a semiconductor device. For simplicity, some steps may be omitted, performed in another order and/or combined. Further, the method 100 may start after other steps in forming the semiconductor device have been performed. For example, the method may start after various have been provided in the substrate provided. FIGS. 2A-2D depict portions of an exemplary embodiment of a semiconductor device 200 during fabrication of the optical vias using the method 100. For simplicity, not all components are shown in FIGS. 2A-2D and FIGS. 2A-2D are not to scale. Further, the thickness of the layers may be exaggerated for explanatory purposes. Although a single optical via is shown as being fabricated, one of ordinary skill in the art will recognize that multiple components of each type are generally formed. The method 100 is described in the context of the semiconductor device 200. However, nothing prevents the method 100 from being used with a different semiconductor device.

A hard mask is formed on the front surface of the semiconductor substrate, via step 102. The hard mask has an aperture that exposes the underlying semiconductor substrate. Step 102 may include providing a thin oxide layer on the semiconductor substrate, depositing a mask layer, and patterning the oxide and mask layers to form a hard mask.

A portion of the semiconductor substrate exposed by the aperture is removed, via step 104. Consequently, a via hole is formed in the semiconductor substrate. In some embodiments, step 104 is carried out using through silicon via (TSV) technology.

Figure 2A:
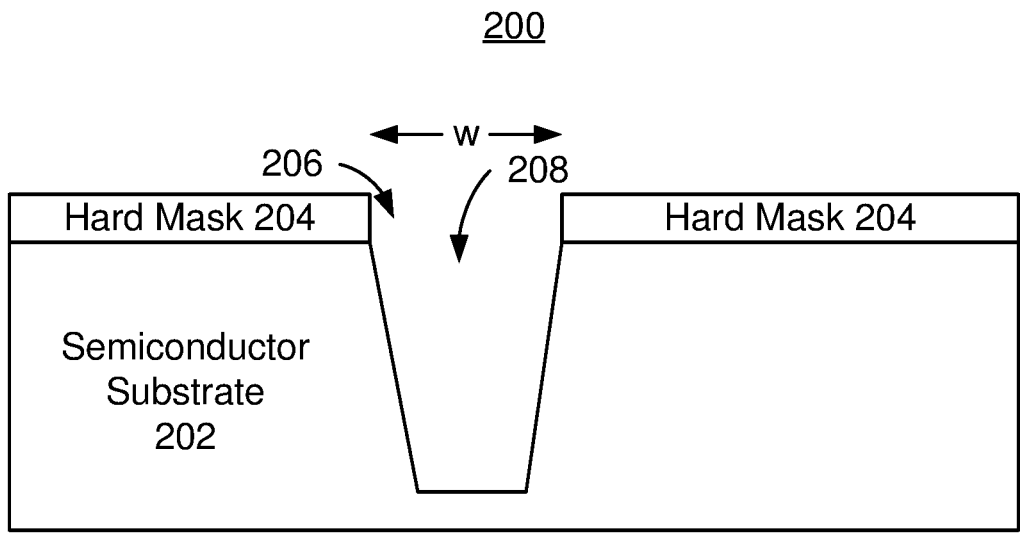
FIGS. 2A-2D depict portions of an exemplary embodiment of a vertical optical via during fabrication.

FIG. 2A depicts the semiconductor device 200 after step 104 is performed. Thus, the hard mask 204 having aperture 205 is shown on the semiconductor substrate 202. The semiconductor substrate may be formed of silicon. In some embodiments, the semiconductor substrate 202 is a full thickness silicon wafer. In other embodiments, the semiconductor substrate 202 is a thinned silicon wafer. However, the method and device may be extended to other substrates, such as GaAs. The via hole 208 is also shown. In some embodiments, the via hole has a substantially circular cross-section. The via hole has a bottom and a width, w. Thus, the hole 208 does not extend completely through the semiconductor substrate. The optical via is to be formed in the via hole 208. The optical via is configured to transmit optical data carried by light of a particular wavelength range. In some embodiments, the optical via being formed and thus the via hole 208 are sufficiently narrow to be single mode the range of wavelengths of light being transmitted by the optical via. Thus, the width, w, may be sufficiently small to provide a single mode optical via. In some embodiments, the width is not more than one hundred micrometers. In some cases, the width is at least ten micrometers. In some embodiments, the width is at least twenty micrometers.

Figure 2B:
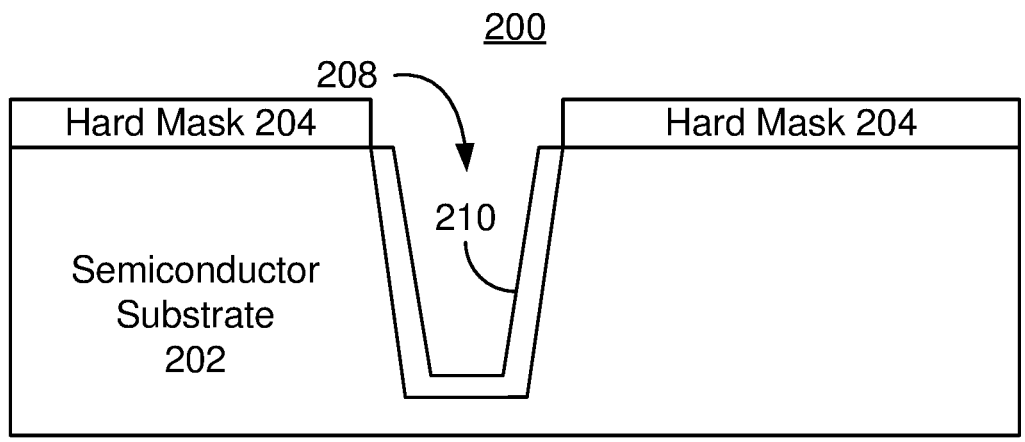

At least one cladding layer is provided in the via hole 208, via step 106. The cladding layer may be formed by thermal oxidation of the sidewalls of the hole 208. Thus, for a silicon substrate, the cladding layer may be formed of silicon dioxide. In another embodiment, the cladding layer may be deposited. For example, a deposited cladding layer might include one or more of silicon oxy-nitride, titanium dioxide, aluminum oxide, a siloxane-based material, lithium calcium aluminum fluoride and magnesium fluoride. A portion of the cladding layer residing in the hole becomes the cladding for the optical via being formed. FIG. 2B depicts the semiconductor device 200 after step 106. Thus, the cladding layer 210 is shown. For clarity, the aperture 206 is only labeled in FIG. 2A. in the hole the at least one cladding layer having at least a first index of refraction;

At least one core layer is provided in the via hole, via step 108. Step 108 may include blanket depositing the core layer(s), planarizing the semiconductor device 200. As part of this planarization, part of the core layer away from the via hole 208 may be etched to improve planarization. The remaining portion of the core material in the hole after planarization may be oxidized.

The core layer(s) provided in step 108 have indices of refraction greater than those of the cladding layer(s). In some embodiments, the core layer(s) are silicon-based material(s). Such materials may ensure uniform fill of the via hole 208, which is deep (e.g. on the order of 200 micrometers or more). In other embodiments, other material(s) may be used. However, the core index of refraction is desired to exceed the cladding index of refraction. For example, the core layer(s) may include one or more of germanium, silicon nitride, a polymer, a siloxane-based material, strontium titanate, barium strontium titanate, magnesium oxide, titanium dioxide, zinc dioxide, zirconia dioxide, zinc selenide and titanium nitride. The hard mask may also be removed.

Figure 2C:
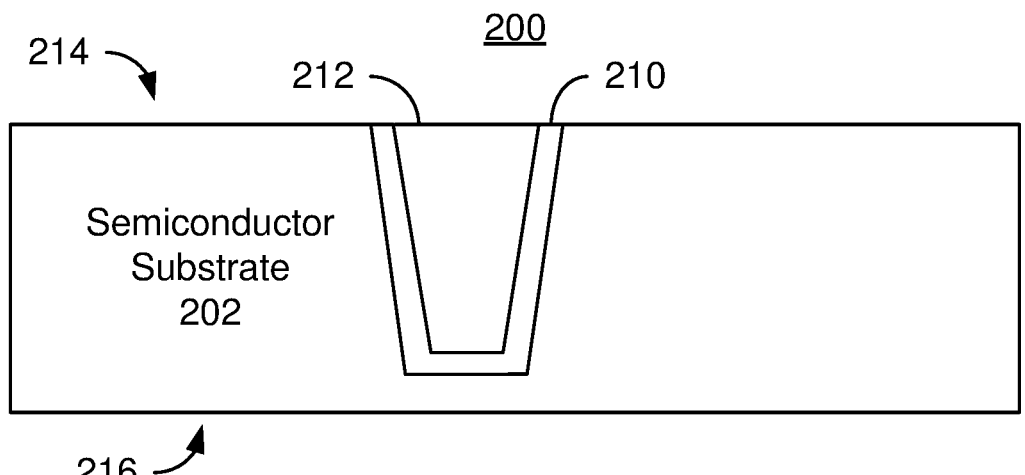

FIG. 2C depicts the semiconductor device after step 108 is performed. Thus, the core material(s) 212 and cladding 210 remain in the via hole 208 (not labeled in FIGS. 2C-2D). An oxide layer (not shown) may be provided on the front surface 214 of the semiconductor device 200. At this point, the semiconductor device 200 may be flipped, aligned with and bonded to another die (not shown) on which photonic devices have been formed. Alternatively, photonic devices such as waveguides and coupling devices such as gratings or turning mirrors may be fabricated onto the front surface 214 of the semiconductor substrate 202. For simplicity, such structures are not shown in FIG. 2C. As can be seen in FIG.

2C, the back side 216 of the semiconductor substrate still covers the bottom of the via hole 208 such that the core 212 is not exposed.

A portion of the semiconductor substrate including the back side 214 and the bottom of the via hole 208 is removed, via step 110. Step 110 may be performed at least in part by bonding the substrate 202 to a carrier wafer and grinding the back 216 of the wafer 202. Thus, the core layer(s) and part of the cladding 210 are exposed.

Figure 2D:
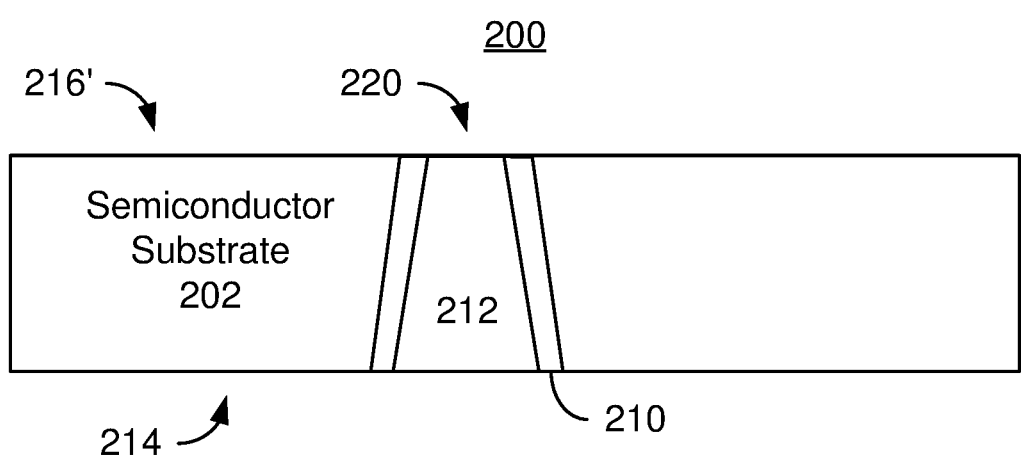

FIG. 2D depicts the semiconductor device after step 110 is performed. Thus, the device 200 has been flipped. The core material(s) 212 and cladding 210 are exposed on the front surface 214 and the bottom surface 216. Consequently, optical via 220 may be considered to be formed. The optical via 220 extends through the remaining portion of the semiconductor substrate 202, from the front side 214 to the bottom surface 216 exposed by grinding. An oxide layer (not shown) may be provided on the front surface 214 of the semiconductor device 200. Photonic devices such as waveguides and coupling devices such as gratings or turning mirrors may be fabricated onto the bottom surface 216 of the semiconductor substrate 202. For simplicity, such structures are not shown in FIG. 2D. Alternatively, another die (not shown) having photonic devices might be aligned to the semiconductor device 200 and bonded to the bottom surface 216 of the semiconductor device 200.

The method 100 forms optical vias 220 that provide transmission of optical data completely through a semiconductor substrate 202. These optical vias may be microscopic in size, for example not more than one hundred micrometers in diameter. Such sizing may be accomplished using TSV. The arrangement of such optical vias 220 may eliminate airgaps and provide a tighter bonding layout. The optical vias 220 may efficiently transmit energy and, in some embodiments, may be single mode. Thus, high bandwidth, ultra-fast intra-die communication may be facilitated. Follow-on processes such as formation of photonic devices on the substrate 202 may be carried out. The optical vias 220 may be aligned with photonic devices on other substrates/other dies using known wafer bonding processes. Thus, fabrication is improved. The optical vias 220 are also compatible with multiple types of waveguides and coupling structures. For example, the optical via 220 may be used in conjunction with monolithic or heterogenous waveguides having a transverse orientation, coupling gratings and turning mirrors. Consequently, use of the optical vias 220 may be flexible.

Figure 3:
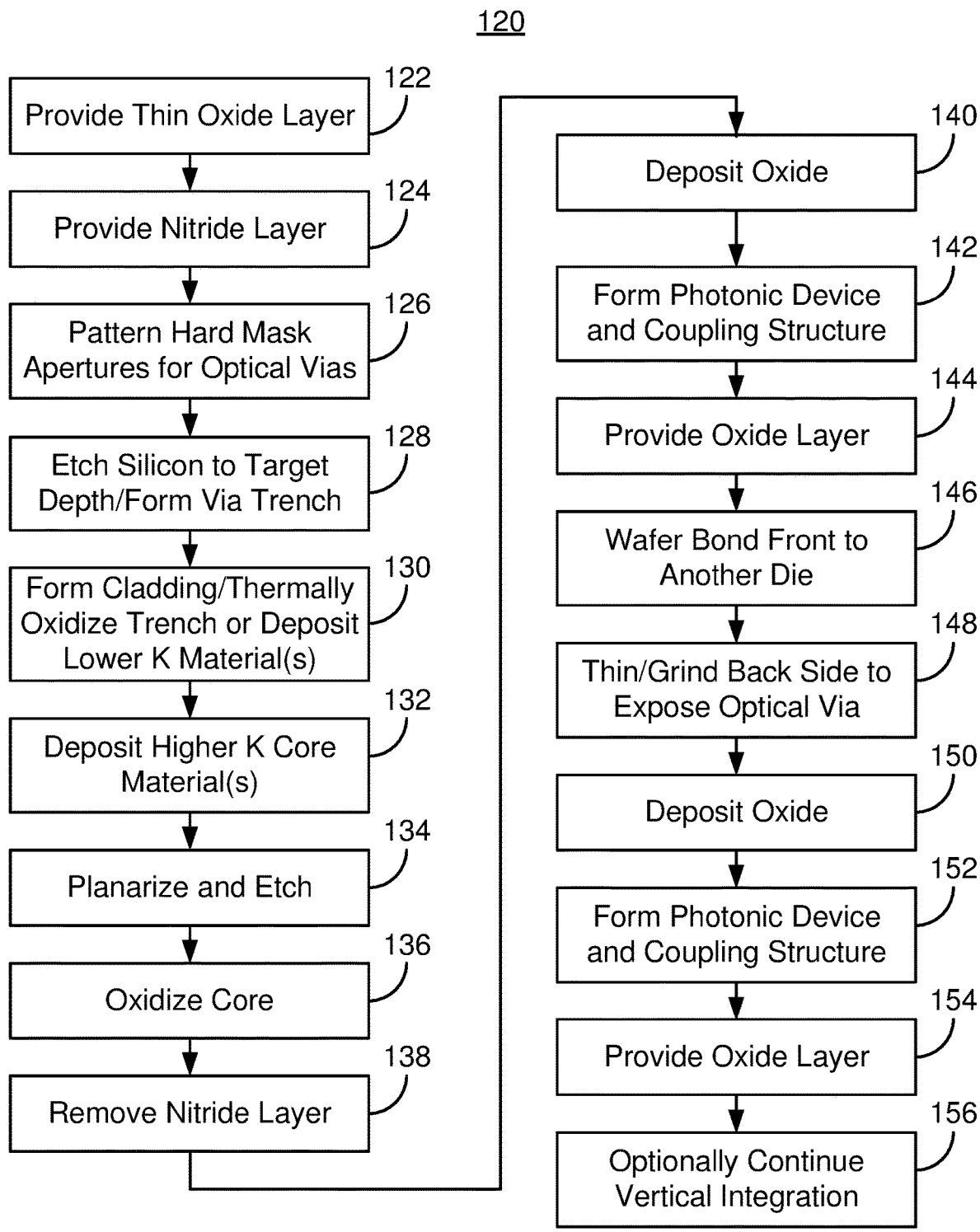
FIG. 3 is a flow chart depicting an exemplary embodiment of a method for providing a vertical optical via in a semiconductor device.

FIG. 3 is a flow chart depicting an exemplary embodiment of a method 120 for providing a semiconductor device using optical vias. For simplicity, some steps may be omitted, performed in another order and/or combined. Further, the method 120 may start after other steps in forming the semiconductor device have been performed. FIGS. 4-17 depict portions of an exemplary embodiment of a semiconductor device 250, during fabrication. For simplicity, not all components are shown in FIGS. 4-17 and FIGS. 4-17 are not to scale. For example, only certain photonic components are shown. Electrical interconnects and other electrical structures such as transistors, are not shown for simplicity. The thickness of the layers may be exaggerated for explanatory purposes. For clarity, only the structures in the region of the optical vias being formed are shown. Thus, the underlying topology has not been indicated. The method 120 is described in the context of the semiconductor device 250. However, nothing prevents the method 120 from being used with a different semiconductor device.

Figure 4:
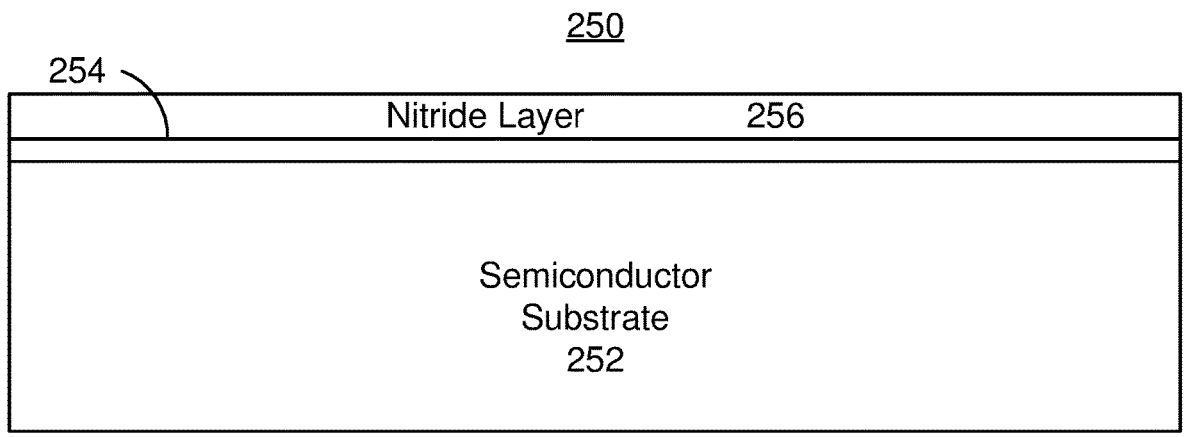
FIGS. 4-17 depict portions of an exemplary embodiment of a semiconductor device having vertical optical via(s) during fabrication.

A thin oxide layer is provided on the front side of the semiconductor (e.g. silicon) substrate, via step 122. A nitride layer is also provided on the front side of the silicon substrate, via step 124. Step 124 may include depositing one hundred nanometers through two hundred nanometers of silicon nitride. The thin oxide layer and nitride layer provided in steps 122 and 124 may form the hard mask. FIG. 4 depicts the semiconductor device 250 after step 124 is performed. Thus, the semiconductor substrate 252, silicon oxide layer 254 and silicon nitride layer 256 are shown.

Figure 5:
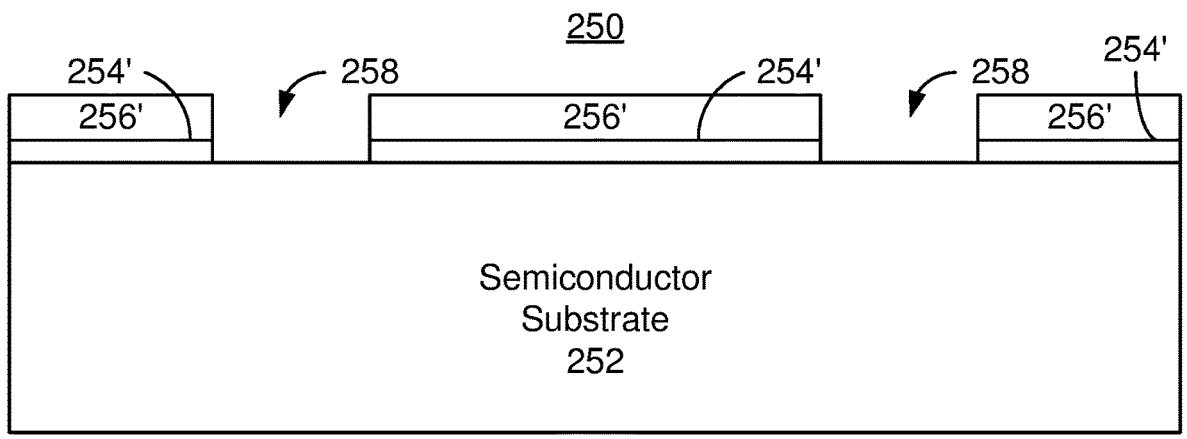

The hard mask is patterned, via step 126. Thus, the nitride layer 254 and underlying silicon oxide layer 252 may be patterned using conventional photolithographic techniques. For example, a photoresist layer may be provided and patterned such that portions are removed above the locations at which the apertures in the hard mask are desired. The layers 252 and 254 may then be etched through to expose the underlying semiconductor substrate 252. FIG. 5 depicts the semiconductor device 250 after step 126 is performed. Consequently, apertures 258 have been formed in the oxide layer 254' and the nitride layer 256'.

Figure 6:
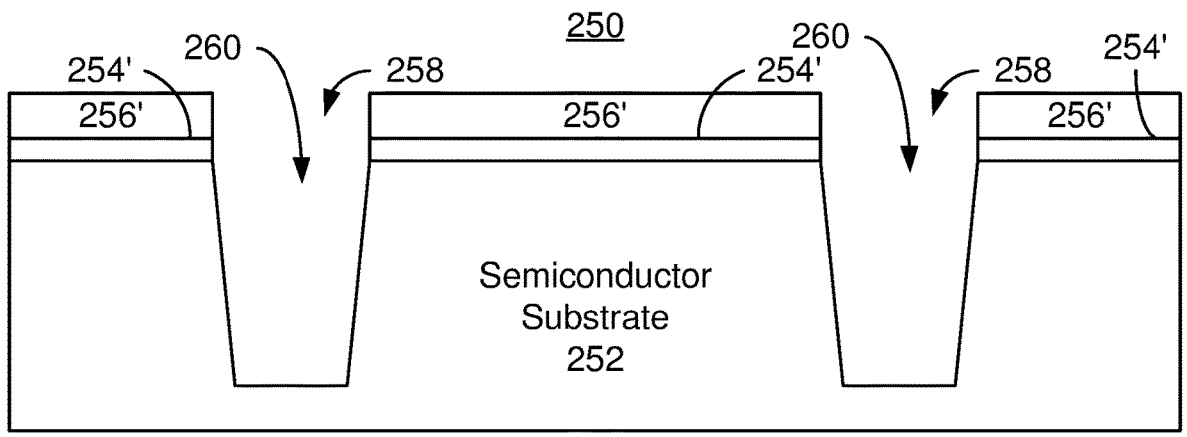

The semiconductor substrate 252 is then etched to the target depth, via step 128. Consequently, the regions of the semiconductor substrate 252 exposed by the apertures 258 are removed. FIG. 6 depicts the semiconductor device 250 after step 128 has been performed. Consequently, via holes 260 have been formed in the semiconductor substrate 252. Optical vias extending through the semiconductor substrate 252 are desired to be formed. Thus, the target depth for the via holes 260 is slightly larger than the desired depth of the optical vias. In some embodiments, the optical via being formed and thus the via holes 260 are sufficiently narrow to be single mode the range of wavelengths of light being transmitted by the optical via. In some embodiments, the width of the via holes 260 is at least twenty micrometers and not more than one hundred micrometers. For simplicity, the via holes are only labeled in FIG. 6.

Figure 7:
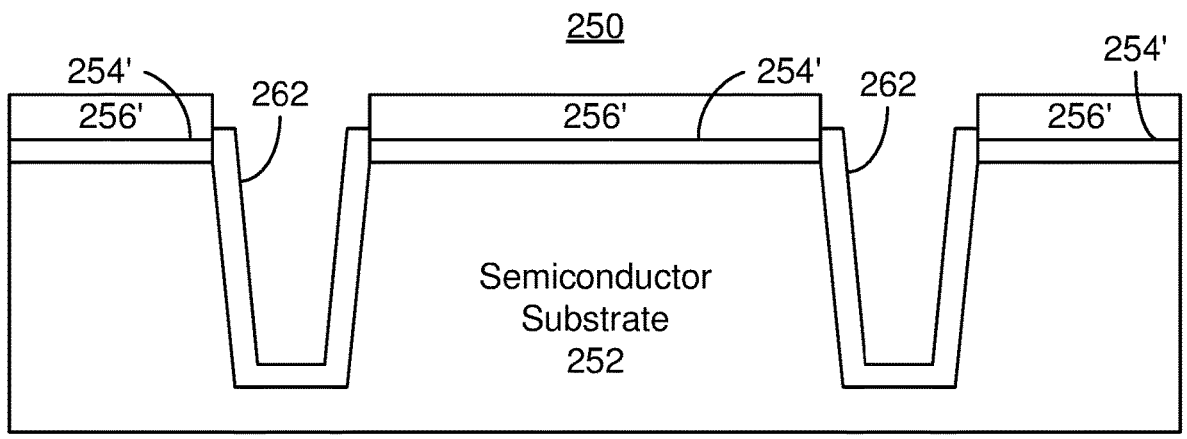

The cladding for the optical vias is provided, via step 130. Step 130 may be performed by thermally oxidizing the sidewalls of the holes 260. For example, a high-pressure oxidation step may be used to improve uniformity and reduce the time of formation. The oxide may be at least one micrometer and not more than two micrometers thick. Alternatively, the cladding layer may be deposited if an index of refraction different from that of the oxidized substrate (e.g. silicon oxide) is desired. Deposited cladding materials may be selected if shorter wavelengths are used in the optical signals carried by the optical vias being formed. FIG. 7 depicts the semiconductor device 250 after step 130 is performed. Consequently, cladding 262 has been formed in the via holes 260.

Figure 8:
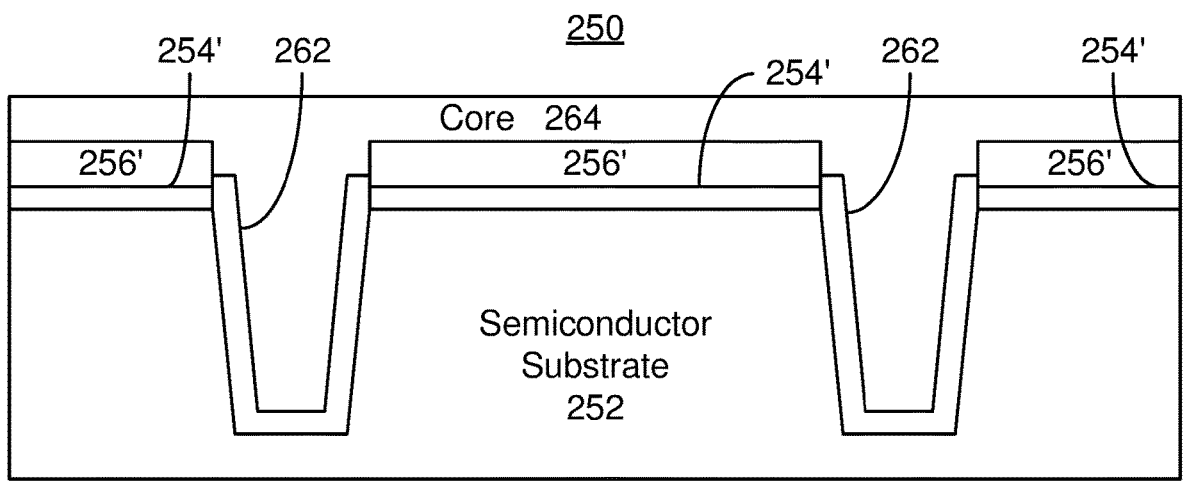

The core material(s) are deposited, via step 132. The core has a higher index of refraction than the cladding 262. Silicon based materials may be desired to be provided in step 132 to improve filling of the via holes 260. However, other materials may be used. Such materials may be desired if other wavelengths (longer or shorter) than those supported by silicon-based materials are to be transmitted by the optical vias being formed. FIG. 8 depicts the semiconductor device 250 after step 132 is performed. Thus, the core materials 264 have been deposited across the surface of the device 250.

Figure 9:
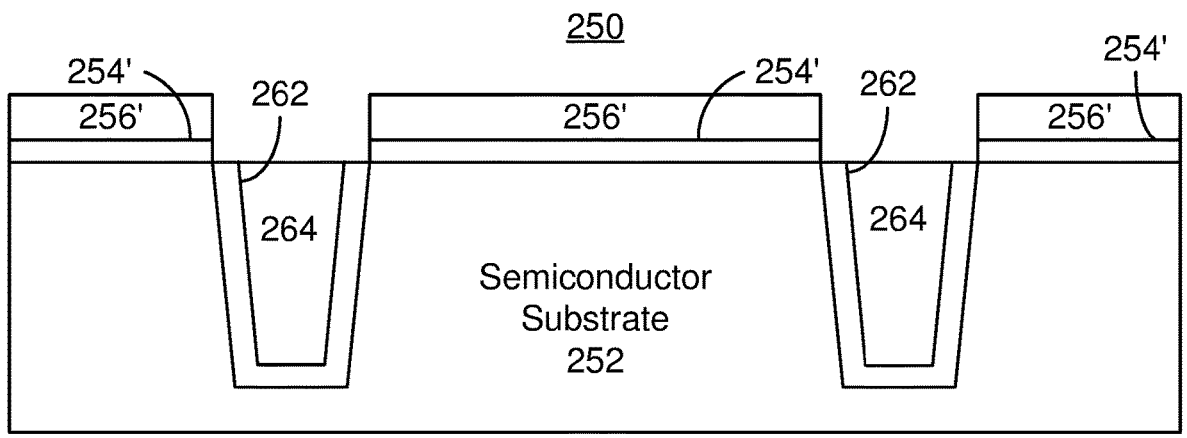

A planarization and etch may be performed, via step 132. For example, an inverse etch mask and plasma etch may be used to reduce the thickness of the core 264 away from the via holes 260. This may improve uniformity of the planarization. The semiconductor device 250 may then be polished, for example using a ceria compound, to planarize the core 264. An additional etch near the via holes 260 may also be performed. FIG. 9 depicts the semiconductor device 250 after step 132 is performed. Thus, the excess material has been removed, leaving the core material 264 in and around the via holes 260.

Figure 10:
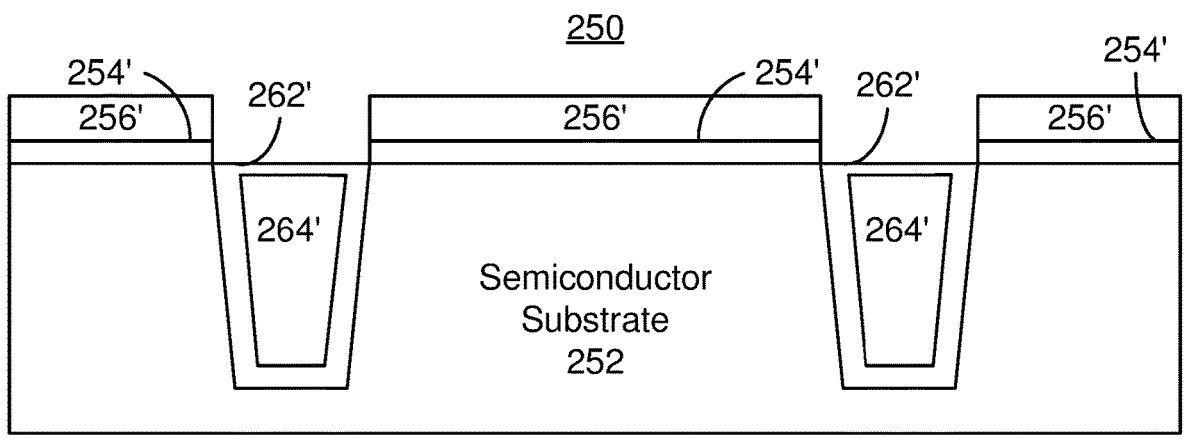

The exposed silicon core 264 may then be oxidized, via step 136. Step 136 may not be performed if another core material is provided in step 132. Instead, a thin protective layer such as a non-silicon nitride might be provided. FIG. 10 depicts the semiconductor device 250 after step 136 has been carried out. A thin silicon oxide layer has formed on the top of the core 264'. This layer and the cladding together are denoted as 262'.

Figure 11:
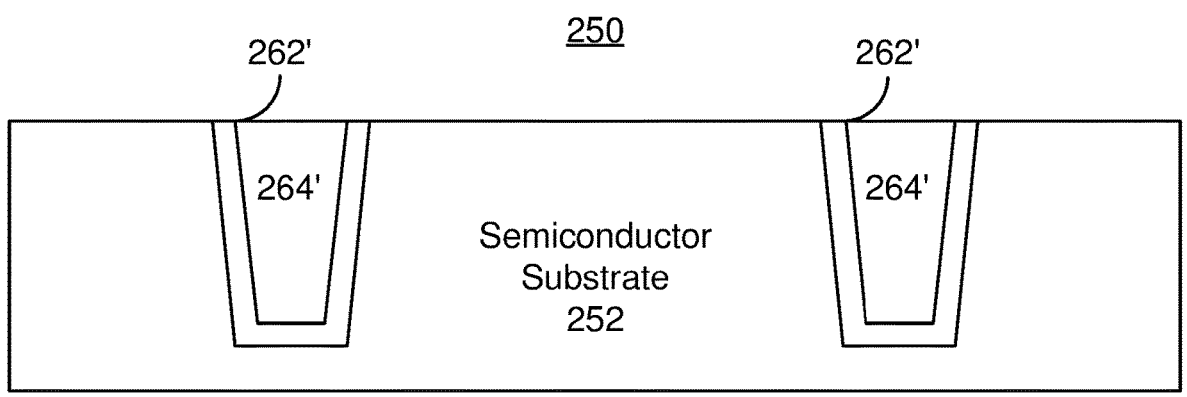

The nitride layer 256' may be removed, via step 138. FIG. 11 depicts the semiconductor device 250 after step 138 is performed. The thin oxide 254' is also removed in this embodiment. Thus, the top of the semiconductor substrate 252 and layer 262' are exposed.

Figure 12:
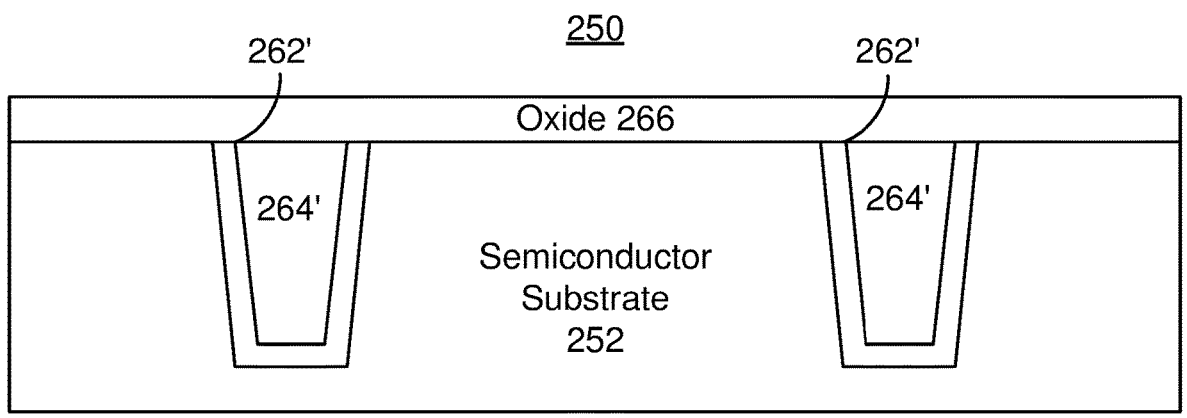

An oxide layer is provided, via step 140. Step 140 may include depositing a low stress silicon dioxide layer. For example, the layer may be at least one thousand nanometers and not more than three thousand nanometers. FIG. 12 depicts the semiconductor device 250 after step 140 is performed. Thus, oxide layer 266 is shown.

Photonic devices such as waveguides and coupling structures may be formed, via step 142. These photonic devices may also be enclosed in an oxide layer, via step 144. This oxide layer may, for example, be at least one hundred and not more than one thousand five hundred nanometers thick. The semiconductor substrate 252 may then be bonded to another die, via step 146. Step 146 might be skipped if three-dimensional wafer integration is not desired. In some embodiments, the photonic devices formed in step 142 are fabricated on the oxide layer 266. Thus, such photonic devices may be formed on the front surface of the semiconductor substrate 252. The photonic devices are aligned to the core 264' of the optical vias as the photonic devices are formed. In such cases, the semiconductor substrate 252 may then be bonded in step 146 to improve mechanical stability during bonding or for three-dimensional integration. In another embodiment, the photonic devices formed in step 142 are fabricated on a different substrate. In such cases, the semiconductor substrate 252 front of the semiconductor substrate may be bonded to the additional die containing the photonic devices. In such an embodiment, the core 264' is aligned to the appropriate portions of the photonic devices on the additional die.

Figure 13A:
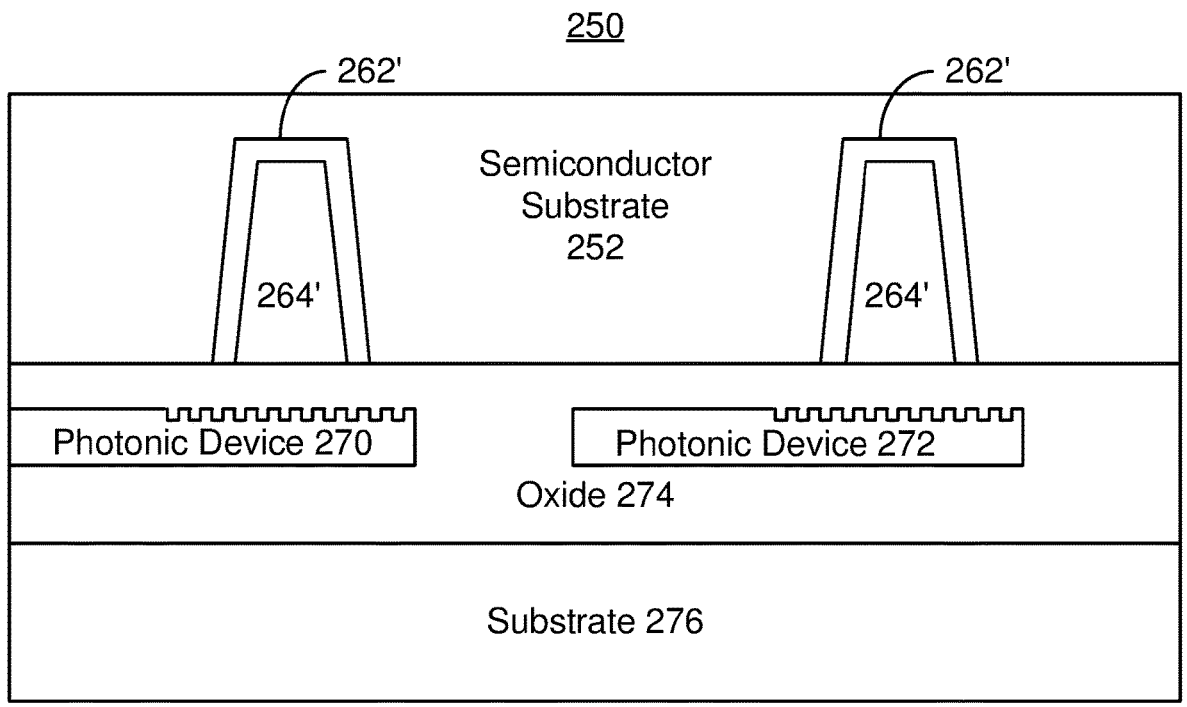
Figure 13B:
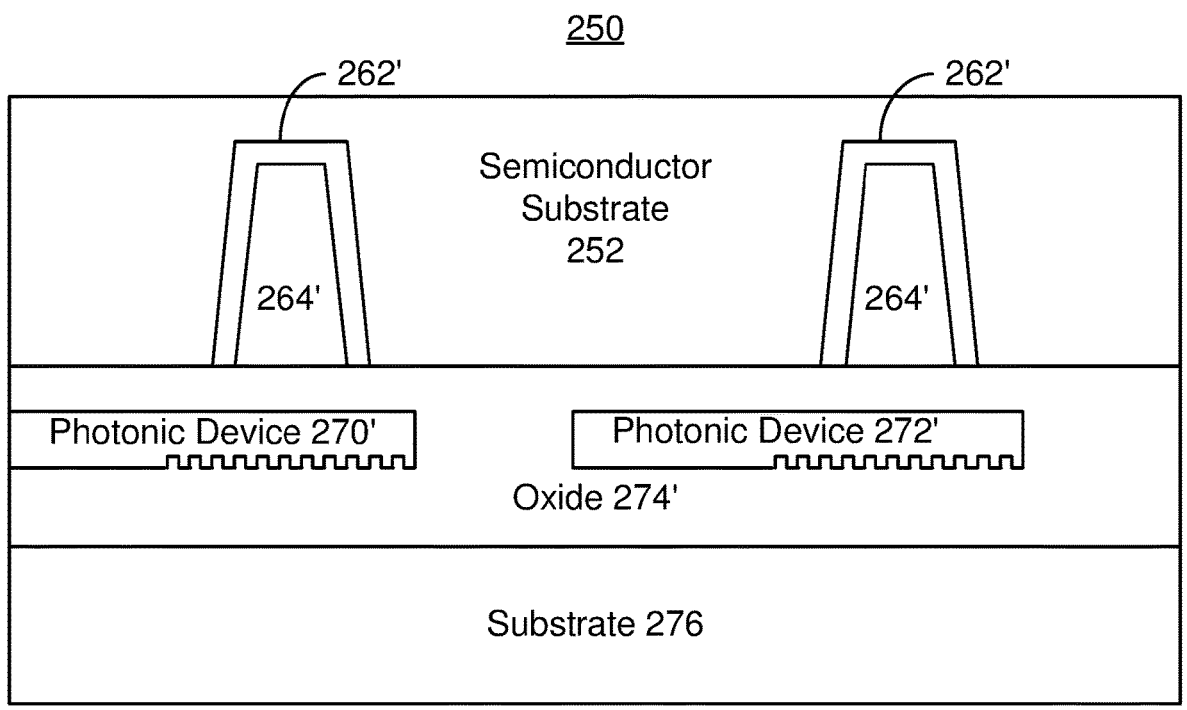

FIGS. 13A and 13B depict embodiments of the semiconductor device 250 and 250' after step 146 is performed. For the semiconductor device 250 depicted in FIG. 13A, the photonic devices 270 and 272 (e.g. waveguides) are formed on the substrate 276. Also shown is oxide 274. Oxide 274 may include multiple oxide layers: one on the substrate 276 on which the photonic devices 270 and 272 are formed, one enclosing the photonic devices 270 and 272, and one on the top surface of the semiconductor substrate 252 (oxide layer 268, which is not separately indicated). As can be seen in FIG. 13A, the semiconductor substrate 252 containing the cladding 264' has been flipped. For the semiconductor device 250' depicted in FIG. 13B, the photonic devices 270' and 272' (e.g. waveguides) are formed on the semiconductor substrate 252. Also shown is oxide 274'. Oxide 274 may include multiple oxide layers: oxide layer 268 (not separately indicated) on which the photonic devices 270' and 272' are formed, one enclosing the photonic devices 270' and 272', and one on the top surface of the semiconductor substrate 276. As can be seen in FIG. 13B, the semiconductor substrate 252 containing the cladding 264' has been flipped. The semiconductor devices 250 and 250' are functionally analogous. Consequently, reference is made to semiconductor device 250 in subsequent discussions.

Figure 14:
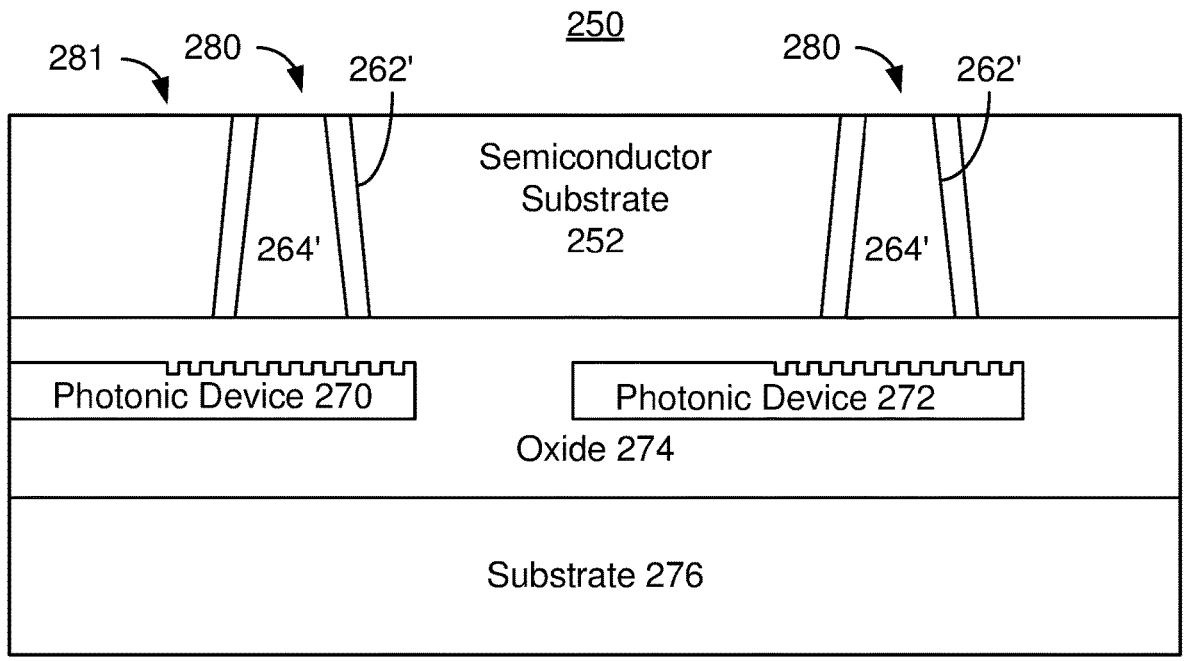

The back side of the semiconductor substrate 252 is removed, typically via grinding, via step 148. Thus, the materials 264' and 262' within the via holes 260 are exposed. FIG. 14 depicts the semiconductor device 250 after step 148 is performed. A portion of the semiconductor substrate 252 has been removed from the back side. Thus, the back surface 281 is exposed. Also exposed are the core 264' and cladding 262' that were at the bottom of the via holes 260. Thus, the optical vias 280 are formed. The optical vias 280 extend and may carry optical data through the semiconductor substrate 252.

An oxide layer may be deposited on the back surface 281 of the semiconductor substrate 252, via step 150. For example, at least one hundred and not more than one thousand five hundred nanometers of silicon dioxide might be deposited. Additional photonic devices including coupling structures may be provided, via step 152. These photonic devices may be encapsulated in an additional oxide layer, via step 154. For example, at least one hundred and not more than one thousand five hundred nanometers of silicon dioxide may be deposited. For simplicity, the back surface 281 of the semiconductor substrate 252 is only labeled in FIG. 14.

Figure 15:
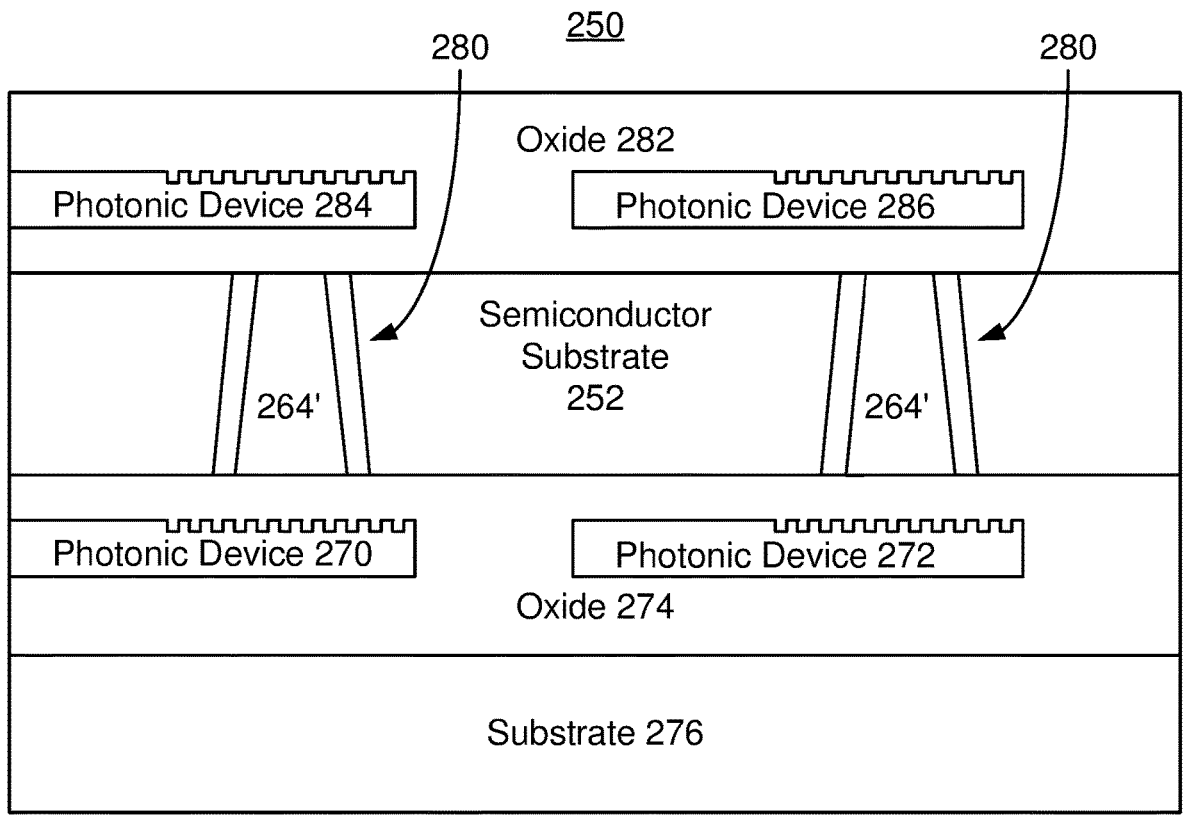
Figure 16:
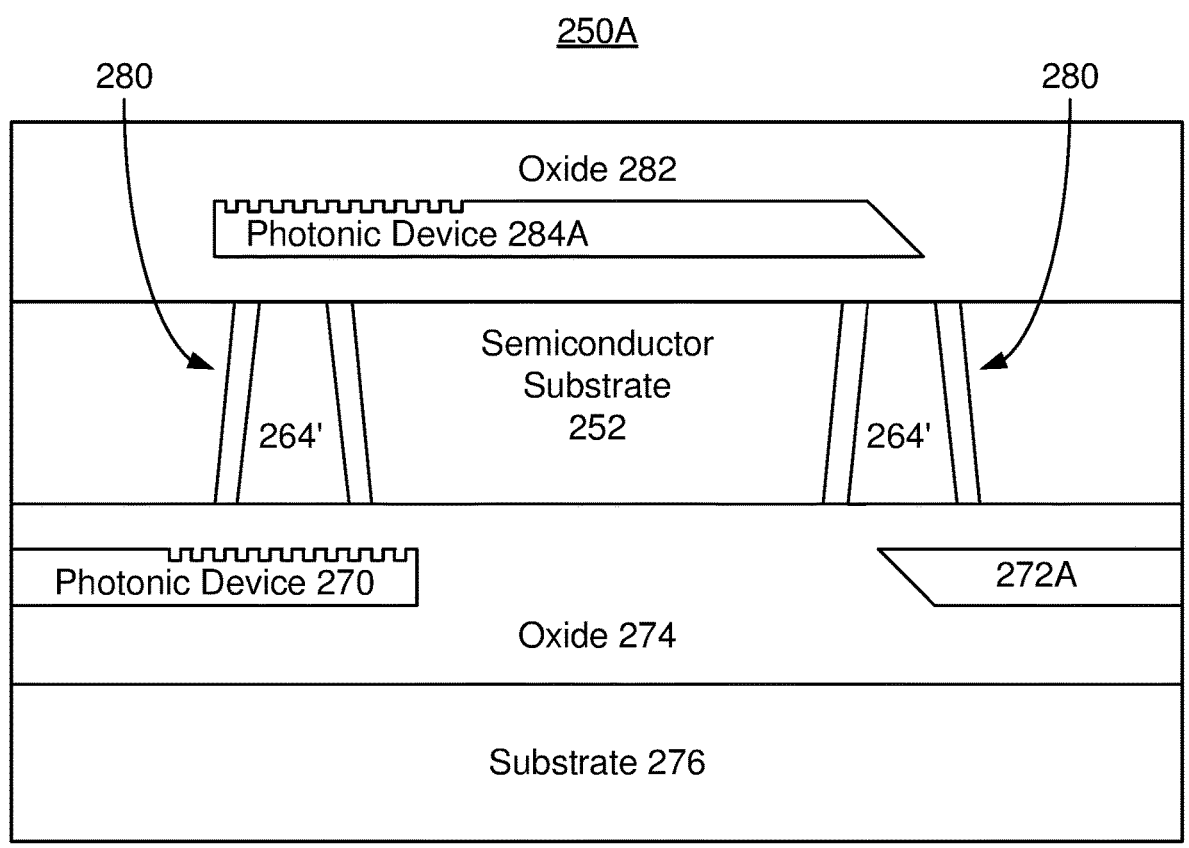

FIG. 15 depicts the semiconductor device after step 154 has been performed. Thus, additional oxide 280 and photonic devices 284 and 286 have been formed. The oxide 282 may include multiple oxide layers formed in step 142 (on which the photonic devices 284 and 286 are fabricated) and in step 146 (encapsulating the photonic devices 284 and 286). Thus, the optical vias 280 can transmit optical signals between photonic devices 270 and 284 and between photonic devices 272 and 286. In the embodiment shown, the photonic devices 270, 272, 282 and 284 include gratings as coupling structures. In other embodiments, different coupling structure(s) might be used. FIG. 16 depicts another exemplary embodiment of the semiconductor device 250A after step 146 is performed. In this embodiment, the photonic device 284A is fabricated in step 144. Thus, optical signals may be carried between photonic devices 270 and 284A, between photonic devices 272A and 284A and, therefore, between photonic devices 270 and 272A. However, coupling between photonic devices 270 and 272A may be preferred to be carried out directly in other embodiments. In addition, other coupling structures are used. Photonic device 284A includes a grating as well as a turning mirror. Photonic device 272A includes a turning mirror.

Figure 17:
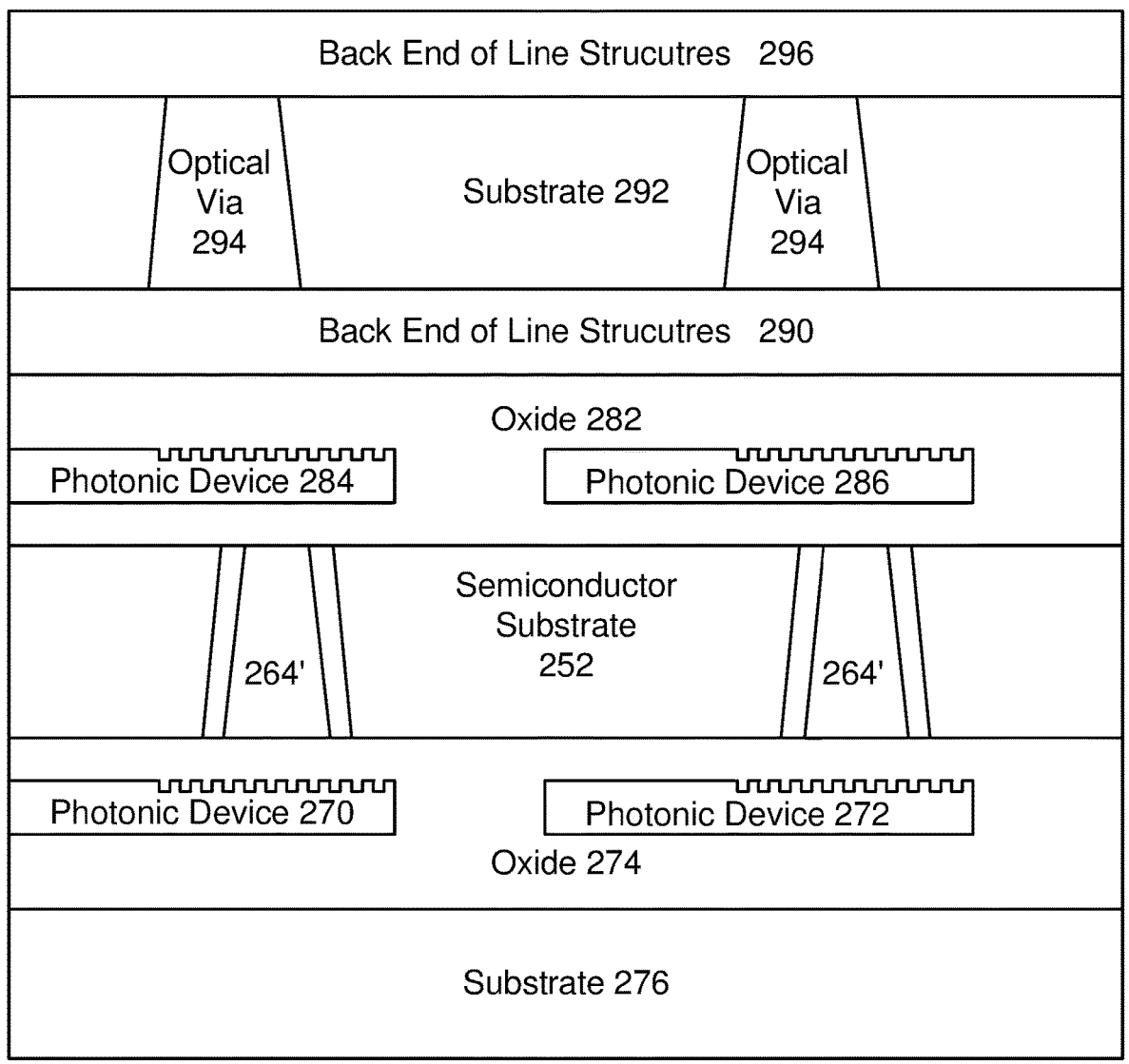

Vertical integration may optionally be continued, via step 156. For example, additional dies including additional optical vias (not shown) may be fabricated and bonded to the semiconductor device 250 or 250A. For example, the die including the substrate 276, oxide 274 and photonic structures 270 and 272/272A may be a logic die. The die including the semiconductor substrate 252, optical vias 280 and photonic device(s) 284/284A and 286 and/or subsequent dies bonded to the semiconductor device may be memory devices such as DRAM dies. FIG. 17 depicts an exemplary embodiment of a semiconductor device 250B in which integration has continued in step 156. Thus, an additional die including back end of line structures 290 and 296, optional optical vias 294 and substrate 292 has been bonded to the remaining dies. Thus, the die including substrate 276 might be a logic die. The die including substrate 292 may be a DRAM device. The die including semiconductor substrate 252 and optical vias 280 may be used only to couple the remaining dies or may be a DRAM or other functional device. Although only three substrates/dies are shown, in other embodiments, additional dies might be integrated in step 156.

The method 120 and semiconductor device 250 may share the benefits of the method 100 and semiconductor device 200. Using the method 120 optical vias 280 may be formed. Such optical vias may efficiently provide transmission of high bandwidth optical data completely through the semiconductor substrate 252/between multiple devices. These optical vias 280 may be microscopic in size, for example not more than one hundred micrometers in diameter. The arrangement of such optical vias 280 may eliminate airgaps and provide a tighter bonding layout. Follow-on processes such as formation of photonic devices on the substrate 252 may be carried out. The optical vias 280 may be aligned with photonic devices on other substrates/other dies using known wafer bonding processes. The optical vias 280 are also compatible with multiple types of waveguides and coupling structures. Thus, fabrication and/or performance of the semiconductor devices 250, 250', 250A and/or 250B may be improved.

A method and system for providing optical vias have been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A semiconductor device comprising:
    a substrate having a front surface and a bottom surface;
    a vertical optical via extending from the front surface to the bottom surface, the vertical optical via having a width of not more than one hundred micrometers, the vertical optical via including at least one cladding layer having at least a first index of refraction and at least one core layer having at least a second index of refraction greater than the at least the first index of refraction, the vertical optical via capable of transmitting an optical signal between the front surface to the back surface;
    at least a first photonic device adjacent to the front surface and aligned with vertical optical via;
    at least a second photonic device adjacent to the bottom surface and aligned with the vertical optical via;
    a first oxide layer adjoining the front surface of the semiconductor substrate and the at least the first photonic device; and
    a second oxide layer adjoining the bottom surface of the semiconductor substrate and the at least the second photonic device.

2. The semiconductor device of claim 1 wherein the width is at least twenty micrometers.

3. The semiconductor device of claim 1 wherein the at least one cladding layer includes at least one of a thermal oxide of the semiconductor substrate, silicon oxy-nitride, titanium dioxide, aluminum oxide, a siloxane-based material, lithium calcium aluminum fluoride and magnesium fluoride.

4. The semiconductor device of claim 1 wherein the at least one core layer includes at least one of a silicon-based material, germanium, silicon nitride, a polymer, a siloxane-based material, strontium titanate, barium strontium titanate, magnesium oxide, titanium dioxide, zinc dioxide, zirconia dioxide, zinc selenide and titanium nitride.

* * * * *